United States Patent
Nagata

(10) Patent No.: US 10,669,964 B2
(45) Date of Patent: Jun. 2, 2020

(54) DIAGNOSIS OF BOOST CAPACITOR USING DISCHARGE CIRCUIT

(71) Applicant: HITACHI AUTOMOTIVE SYSTEMS, LTD., Hitachinaka-shi, Ibaraki (JP)

(72) Inventor: Yasuhiko Nagata, Hitachinaka (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 476 days.

(21) Appl. No.: 15/504,881

(22) PCT Filed: Aug. 5, 2015

(86) PCT No.: PCT/JP2015/072157
§ 371 (c)(1),
(2) Date: Feb. 17, 2017

(87) PCT Pub. No.: WO2016/031509
PCT Pub. Date: Mar. 3, 2016

(65) Prior Publication Data
US 2017/0268449 A1   Sep. 21, 2017

(30) Foreign Application Priority Data
Aug. 25, 2014 (JP) .................... 2014-170033

(51) Int. Cl.
*F02D 41/22* (2006.01)
*F02M 51/06* (2006.01)
(Continued)

(52) U.S. Cl.
CPC .......... *F02D 41/221* (2013.01); *F02D 41/20* (2013.01); *F02D 41/22* (2013.01); *F02M 51/06* (2013.01);
(Continued)

(58) Field of Classification Search
CPC .......... F02D 41/20; F02D 41/22; F02D 41/30; F02D 41/32; F02D 45/00; F02D 41/042;
(Continued)

(56) References Cited

U.S. PATENT DOCUMENTS 5,804,973 A   9/1998 Shinohara et al.
5,818,236 A * 10/1998 Sone .................... B60L 3/0023
                                        324/509

(Continued)

FOREIGN PATENT DOCUMENTS

EP   3144512 A1   3/2017
JP   09-019003 A   1/1997
(Continued)

OTHER PUBLICATIONS

International Search Report, PCT/JP2015/072157, dated Dec. 1, 2015, 2 pgs.

(Continued)

*Primary Examiner* — Son T Le
(74) *Attorney, Agent, or Firm* — Volpe and Koenig, P.C.

(57) ABSTRACT

A fuel injection valve drive control device includes a boost circuit having a boost coil, a switching component (FFT or the like) supplying a switching current from a battery source voltage to the boost coil, and a boost capacitor accumulating a boosted voltage generated by the operation of the switching component; a discharge circuit for discharging the accumulated electric charge via a current limiter (e.g. discharge resistor, constant current source) and a discharge switch (FET or the like); and a monitoring circuit for monitoring the accumulated voltage. The discharge circuit is caused to operate when the control device is shutting down and performs a deterioration/failure diagnosis of the boost capacitor and an operation check of the discharge circuit on the basis of a monitored voltage value of the boost capacitor (Continued)

at starting the discharge operation and a monitored voltage value of the boost capacitor after a predetermined time has elapsed.

4 Claims, 7 Drawing Sheets

(51) Int. Cl.
*F02D 41/20* (2006.01)
*G01R 31/00* (2006.01)
*F02M 61/16* (2006.01)
*G01R 31/64* (2020.01)
*F02M 61/04* (2006.01)
*F02D 41/06* (2006.01)
*F02D 41/04* (2006.01)

(52) U.S. Cl.
CPC ............ *F02M 61/04* (2013.01); *F02M 61/16* (2013.01); *G01R 31/00* (2013.01); *G01R 31/64* (2020.01); *F02D 41/042* (2013.01); *F02D 41/062* (2013.01); *F02D 2041/2006* (2013.01); *F02D 2041/2068* (2013.01); *F02D 2041/2086* (2013.01); *F02D 2041/224* (2013.01); *Y02T 10/40* (2013.01)

(58) Field of Classification Search
CPC ........... F02D 41/062; F02D 2041/2068; F02D 2041/2086; F02D 2041/224; F02D 2041/2006; F02D 41/221; F02M 51/06; F02M 61/04; F02M 61/16; G01R 31/02
See application file for complete search history.

(56) References Cited

U.S. PATENT DOCUMENTS

| | | |
|---|---|---|
| 2009/0174340 A1 | 7/2009 | Kumagai |
| 2009/0183714 A1 | 7/2009 | Mayuzumi |

FOREIGN PATENT DOCUMENTS

| | | |
|---|---|---|
| JP | 2003-127822 A | 5/2003 |
| JP | 2007-113547 A | 5/2007 |
| JP | 2008-115848 A | 5/2008 |
| JP | 2009-164395 A | 7/2009 |
| JP | 2011-247192 A | 12/2011 |

OTHER PUBLICATIONS

Extended European Search Report dated Mar. 15, 2018 for the European Patent Application No. 15835172.6.

* cited by examiner

DIAGNOSIS OF BOOST CAPACITOR USING DISCHARGE CIRCUIT

TECHNICAL FIELD

The present invention relates to a fuel injection valve drive control device for an internal combustion engine, which is mounted on an automobile or the like and executes driving control for a fuel injection valve by using the boosted voltage from an on-vehicle battery, particularly to a technique for diagnosing the failure/deterioration of a boost capacitor used in a boost circuit.

BACKGROUND ART

In a fuel injection valve drive control device for an internal combustion engine which executes the driving control for the fuel injection valve by using the boosted voltage from the on-vehicle battery, a boost capacitor maintains the driving voltage of the fuel injection valve. In the occurrence of the failure/deterioration in the boost capacitor, the maintained voltage drops to cause a delay in rise or reach of the current to be supplied to the fuel injection valve. This results in variation in amount of fuel injection by the fuel injection valve. Thus, the fuel efficiency, the exhaust gas, and the like will deteriorate.

In view of the above, it has been anticipated to detect the failure/deterioration of the boost capacitor accurately and in the occurrence of abnormality, shift the operation to the fail-safe operation quickly.

CITATION LIST

Patent Literature

PTL 1: JP 2011-247192 A
PTL 2: JP H9-19003 A

PTL 1 has disclosed the diagnosis of the deterioration of the boost capacitor. In PTL 1, the number of times of switching operations of the switching element is counted while a predetermined period passes after the boosted voltage stored in the boost capacitor reaches a predetermined voltage, and based on the counted value, the deterioration of the boost capacitor is diagnosed. The present invention is for the similar purpose, which is for diagnosing the boost capacitor. However, the diagnosing method according to the present invention is different in that the control device causes a discharge circuit to operate and the deterioration is diagnosed when the shutdown is executed, and this also serves as the checking of the operation of the discharge circuit that is used only in the emergencies. Thus, the purpose and the diagnosing method are different. In addition, PTL 2 discloses the diagnosis of the deterioration of the smoothing capacitor provided for the inverter for the electromotive vehicle. PLT 2 is for the purpose of determining the lifetime of the smoothing capacitor in the on-board state without removing the capacitor from the inverter. The smoothing capacitor provided for the inverter for the electromotive vehicles and the boost capacitor according to the present invention are different in the circuit part and the component role, thereby being different in purpose.

SUMMARY OF INVENTION

Technical Problem

Some of fuel injection valve drive control devices for internal combustion engines in which the driving of the fuel injection valve is controlled based on the voltage boosted from the on-vehicle battery employ the discharge circuit that releases the charges out of the boost capacitor in emergencies. Such a discharge circuit is used in emergencies and will not operate under normal control; thus, even in the occurrence of a failure in the discharge circuit, such a failure cannot be known and the diagnosis has been impossible.

Solution to Problem

To solve the problem as above, the present invention provides a structure which includes: a boost circuit including a boost coil, a switching element (such as a FET) that supplies switching current from a battery power source voltage to the boost coil, and a boost capacitor that stores boosted voltage generated by an operation of the switching element; a discharge circuit that discharges through a means that restricts current of stored charges (such as a discharging resistor or a constant-current source) and a discharge switch (such as a FET); and a monitoring circuit that monitors the stored voltage, wherein the control device causes the discharge circuit to operate when shutdown is executed, and deterioration/failure of the boost capacitor is diagnosed and an operation of the discharge circuit is checked based on a voltage monitor value of the boost capacitor when a discharge operation starts and a voltage monitor value of the boost capacitor after a predetermined period.

Advantageous Effects of Invention

According to the present invention, the discharge circuit is operated when the boost capacitor is diagnosed. This enables not just the diagnosis of the deterioration/failure in the boost capacitor but also the operation check of the discharge circuit, which is used only in emergencies. If the boost capacitor is diagnosed when the power is supplied, there is a temporal restriction: it is necessary to complete the diagnosis in a short period before the fuel injection valve is driven. However, in the present invention, since the diagnosis is carried out in the shutdown time, the discharging can be carried out at any time, for example, preferentially when the wrong diagnosis is unlikely to occur. The present invention is featured in that the deterioration/failure of the boost capacitor is diagnosed every time in the shutdown state where the fuel injection valve is not in operation. This can eliminate the factor of the wrong diagnosis due to the noise included in the boosted voltage when the fuel injection valve is operated.

DESCRIPTION OF EMBODIMENT

Example 1

Figure 1:
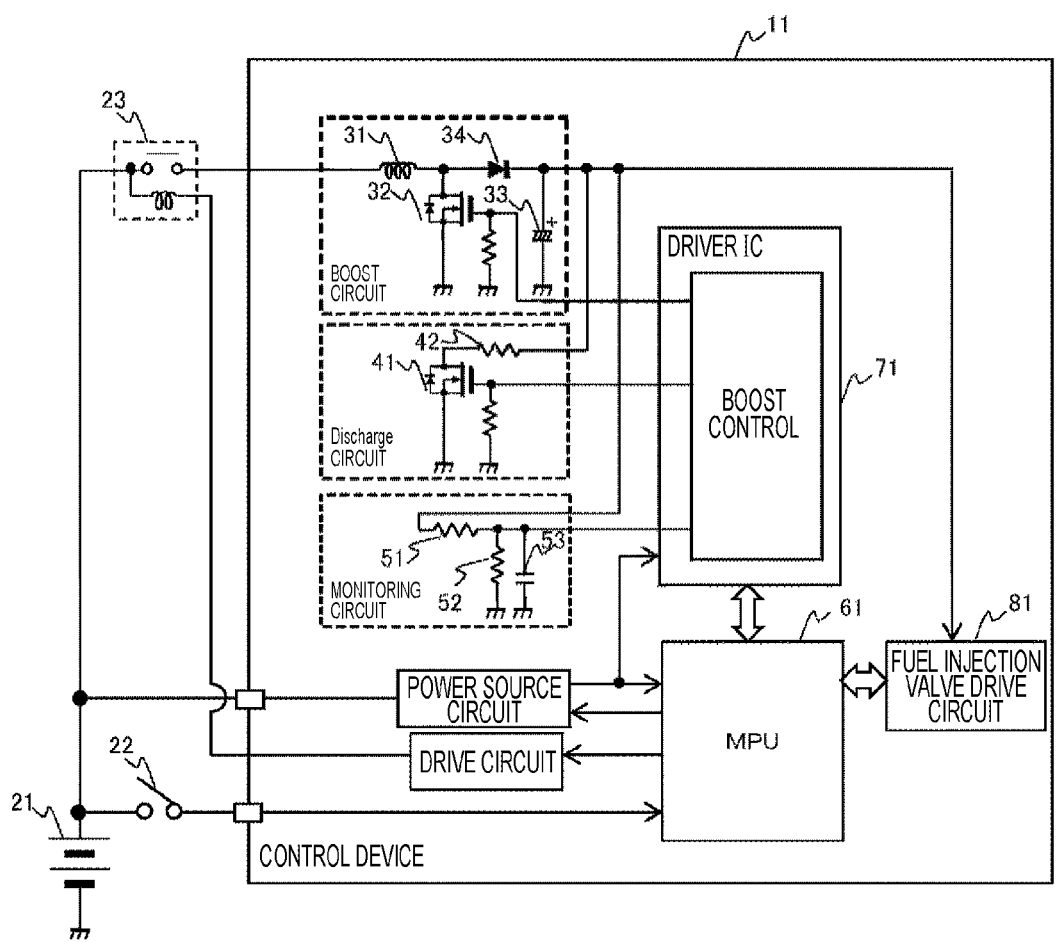
FIG. 1 is a structure diagram illustrating one example of a control device according to the present invention.

Example of the present invention will hereinafter be described with reference to FIG. 1.

A control device 11 includes: a battery power source 21 that supplies power source to the control device 11; a switch 22; a relay 23; a boost circuit including a boost coil 31, a switching element (such as a FET) 32 that supplies the switching current from the battery power source 21 to the boost coil, and a boost capacitor 33 that stores the boosted voltage generated by the operation of the switching element 32; a discharge circuit that discharges through a means 42 that restricts current of stored charges (for example, a discharge resistor or a constant-current source) and a discharging switch 41 (such as FET); and a circuit that includes voltage dividing resistors 51 and 52 and a capacitor 53 and monitors the stored voltage. The control device 11 further includes a driver IC 71 for controlling these boost circuit, discharge circuit, and monitoring circuit, an MPU 61, and a fuel injection valve drive circuit 81.

Figure 2:
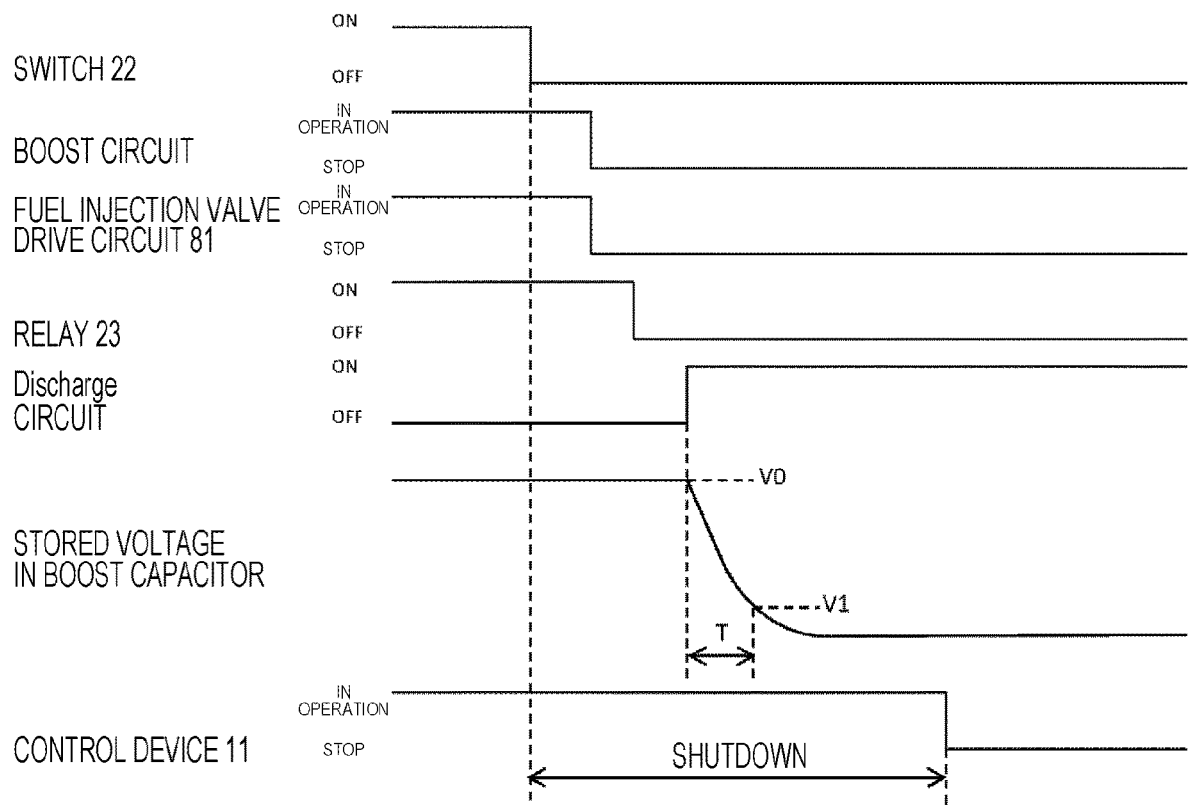
FIG. 2 is a timing chart illustrating one example of the control device according to the present invention.

Next, a method for diagnosing the deterioration/failure of the boost capacitor according to the present invention is described with reference to FIG. 2.

When the MPU 61 has recognized that the switch 22 is turned off while the control device 11 is in operation, the operation shifts to a shutdown down operation. At this time, the MPU 61 turns off the fuel injection valve drive circuit 81, the boost circuit, and the relay 23 and monitors the voltage V0 stored in the boost capacitor 33 with the monitoring circuit. Next, the MPU 61 turns on the discharge circuit and releases the charges stored in the boost capacitor 33. Using the monitoring circuit, the MPU 61 measures the voltage change and the time T when the boost capacitor 33 discharges. The relation between the time T and the voltage change of the boost capacitor in the discharging is expressed by the following formula:

$$t = -CxRx \ln(V1/V0) \qquad \text{Formula 1}$$

Here, t represents the theoretical time relative to the voltage change of the boost capacitor obtained in Formula 1, C represents the capacitance of the boost capacitor 33, R represents the means 42 that restricts current of charges stored in the discharge circuit (in this case, the discharge resistor), V0 represents the voltage of the boost capacitor before the discharge circuit is turned on, and V1 represents the voltage of the boost capacitor after the discharge circuit is turned on.

The MPU 61 compares the measurement result T from the monitoring circuit and the calculation result t from Formula 1, and if T is within the criterion (threshold), it is determined that the boost capacitor and the discharge circuit are normal. If T is over the criterion (threshold), it is determined that the boost capacitor 33 has deteriorated or failed or that the discharge circuit has failed.

Figure 3:
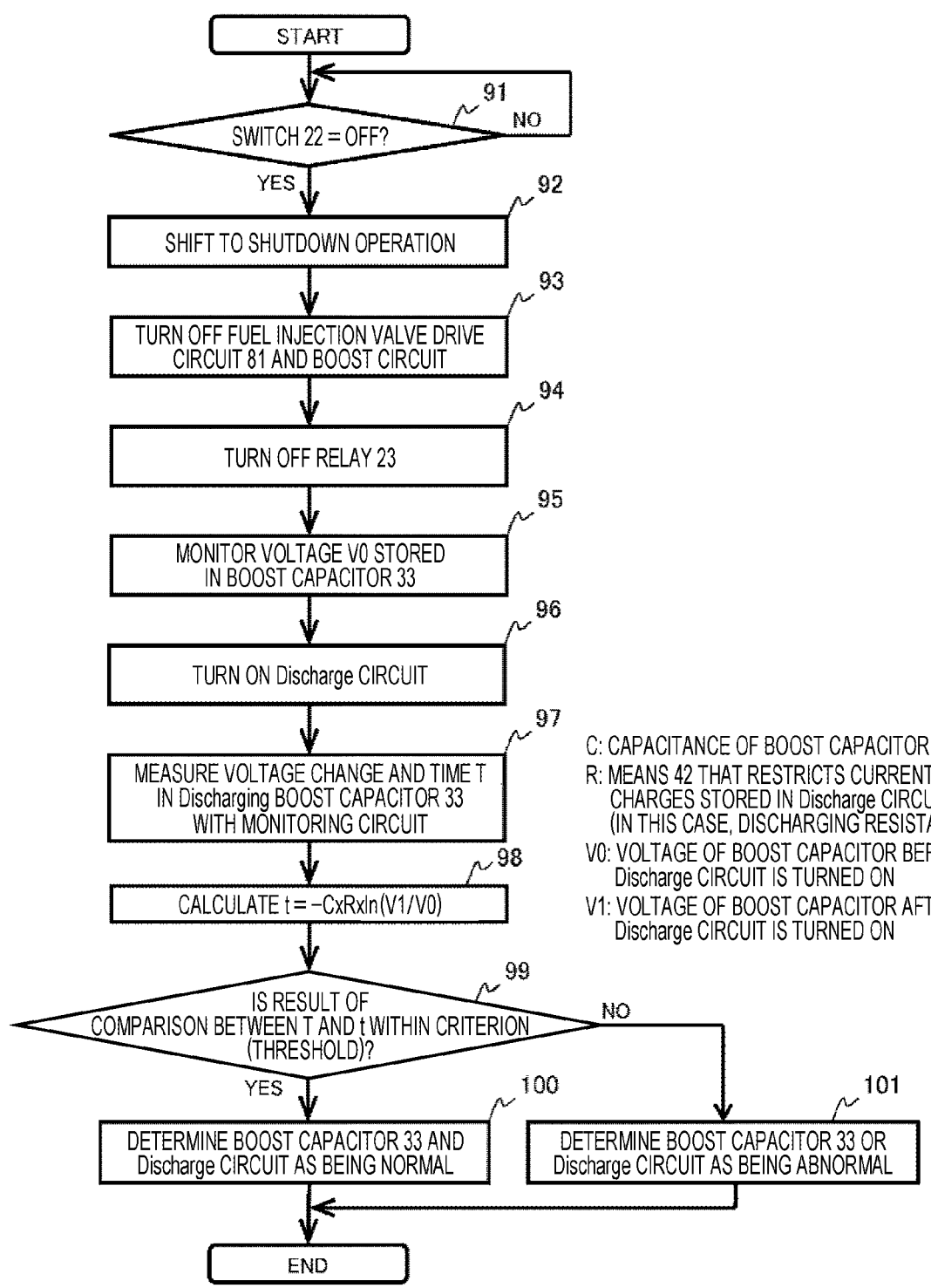
FIG. 3 is a flowchart illustrating one example of the control device according to the present invention.

Next, Example of the present invention will be described with reference to the flowchart of FIG. 3.

This flowchart includes: a branch block 91 in which whether the switch 22 is off is monitored; a block 92 in which the operation shifts to the shutdown operation; a block 93 in which the fuel injection valve drive circuit 81 and the boost circuit are turned off; a block 94 in which the relay 23 is turned off; a block 95 in which the voltage V0 stored in the boost capacitor 33 is monitored; a block 96 in which the discharge circuit is turned on; a block 97 in which the voltage change and the time T in discharging the boost capacitor 33 are measured in the monitoring circuit; a block 98 in which t=−CxRx ln(V1/V0) is calculated; a branch block 99 in which whether the result of comparing T and t is within the criterion (threshold) is compared; a block 100 in which as a result of the above comparison, the boost capacitor 33 and the discharge circuit are determined as being normal; and a block 101 in which the boost capacitor 33 or the discharge circuit is determined as being abnormal.

Next, description is made of the case in which the switch 22 is on.

Upon the start of the present control, the process advances to the branch block 91. Here, whether the operation shifts to the shutdown operation is determined depending on the state of the switch 22. If the switch 22 is on, the operation does not shift to the shutdown operation and the state returns to the initial state.

Next, description is made of the case in which the switch 22 is off and the result of comparing T and t is within the criterion (threshold).

Upon the start of the present control, the process advances to the branch block 91. Here, whether the operation shifts to the shutdown operation is determined depending on the state of the switch 22. Since the switch 22 is off in this description, the process advances to the block 92 and the operation shifts to the shutdown operation. Next, the process advances to the block 93 in which the fuel injection valve drive circuit 81 and the boost circuit are turned off. Then, the process advances to the block 94 in which the relay 23 is turned off. Next, the process advances to the block 95 in which the voltage V0 stored in the boost capacitor 33 is monitored. Next, the process advances to the block 96 in which the discharge circuit is turned on. Next, the process advances to the block 97 in which the voltage change and the time T in discharging the boost capacitor 33 are measured in the monitoring circuit. Then, the process advances to the block 98 in which t=−CxRx ln(V1/V0) is calculated. Next, the process advances to the branch block 99 in which whether the result of comparing T and t is within the criterion (threshold) is compared. In the present description the comparison result between the T and t is within the criterion (threshold); thus, the process advances to the block 100 in which the boost capacitor 33 and the discharge circuit are determined as being normal.

Next, description is made of the case in which the switch 22 is off and the result of comparing T and t is out of the criterion (threshold).

Upon the start of the present control, the process advances to the branch block 91. Here, whether the operation shifts to the shutdown operation is determined depending on the state of the switch 22. Since the switch 22 is off in this description, the process advances to the block 92 and the operation shifts to the shutdown operation. Next, the process advances to the block 93 in which the fuel injection valve drive circuit 81 and the boost circuit are turned off. Then, the process advances to the block 94 in which the relay 23 is turned off. Next, the process advances to the block 95 in which the voltage V0 stored in the boost capacitor 33 is monitored. Next, the process advances to the block 96 in which the discharge circuit is turned on. Next, the process advances to the block 97 in which the voltage change and the time T in discharging the boost capacitor 33 are measured in the monitoring circuit. Then, the process advances to the block 98 in which t=−CxRx ln(V1/V0) is calculated. Next, the process advances to the branch block 99 in which whether the result of comparing T and t is within the criterion (threshold) is compared. In the present description, the comparison result between T and t is out of the criterion (threshold); thus, the process advances to the block 101 in which the boost capacitor 33 or the discharge circuit is determined as being abnormal.

Example 2

Figure 4:
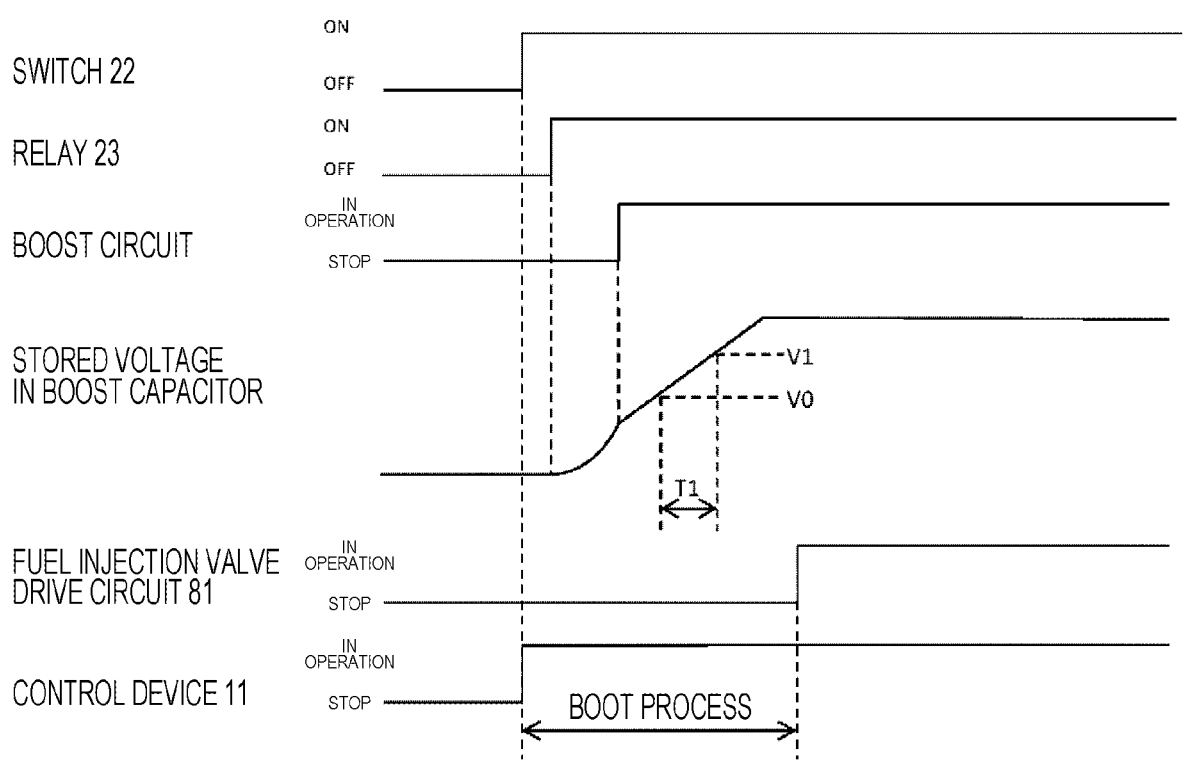
FIG. 4 is a timing chart illustrating another example of the control device according to the present invention.

Next, another Example of the present invention will be described with reference to FIG. 4.

The structure is the same as that of Example 1 described with reference to FIG. 1.

In Example described with reference to FIG. 1, whether the boost capacitor 33 or the discharge circuit is abnormal or not can be diagnosed. On the other hand, an object of the present Example is to specify which part of the boost circuit, the discharge circuit, and the boost capacitor 33 is abnormal, i.e., the part which has failed. The control device 11 executes the boot process when the switch 22 has been turned on to start the MPU 61. On this occasion, the MPU 61 turns on the relay 23 and then causes the boost circuit to operate. The MPU 61 monitors V0 stored in the boost capacitor 33 with the monitoring circuit. The present invention is featured in that the V0 is monitored at a timing after the boost circuit starts to operate while the voltage V0 is more than or equal to the voltage of the battery power source 21. Subsequently, using the monitoring circuit, the MPU 61 measures the voltage change and the time T1 when the boost capacitor 33 boosts. As a result of measuring the time T1 and the voltage change of V0 and V1 in the monitoring circuit, if the voltage change rate $(V1-V0)/T1$ of the boost capacitor 33 is within the criterion (threshold), the MPU 61 determines that the boost capacitor 33 and the boost circuit are normal. If the MPU 61 has determined that the boost capacitor 33 and the boost circuit are normal, the fuel injection valve drive circuit 81 is operated to end the boot process and the process shifts to the normal operation. If the voltage change rate $(V1-V0)/T1$ of the boost capacitor 33 is over the criterion (threshold), it is determined that the boost capacitor 33 has deteriorated or failed or that the boost circuit has failed.

If the boost capacitor 33 and the boost circuit are determined being abnormal, the MPU 61 shifts the operation to the fail-safe operation. The fail-safe operation indicates, for example, the operation in which the user is notified of an abnormality or the engine is not started or is started but under a restricted condition.

Figure 5A:
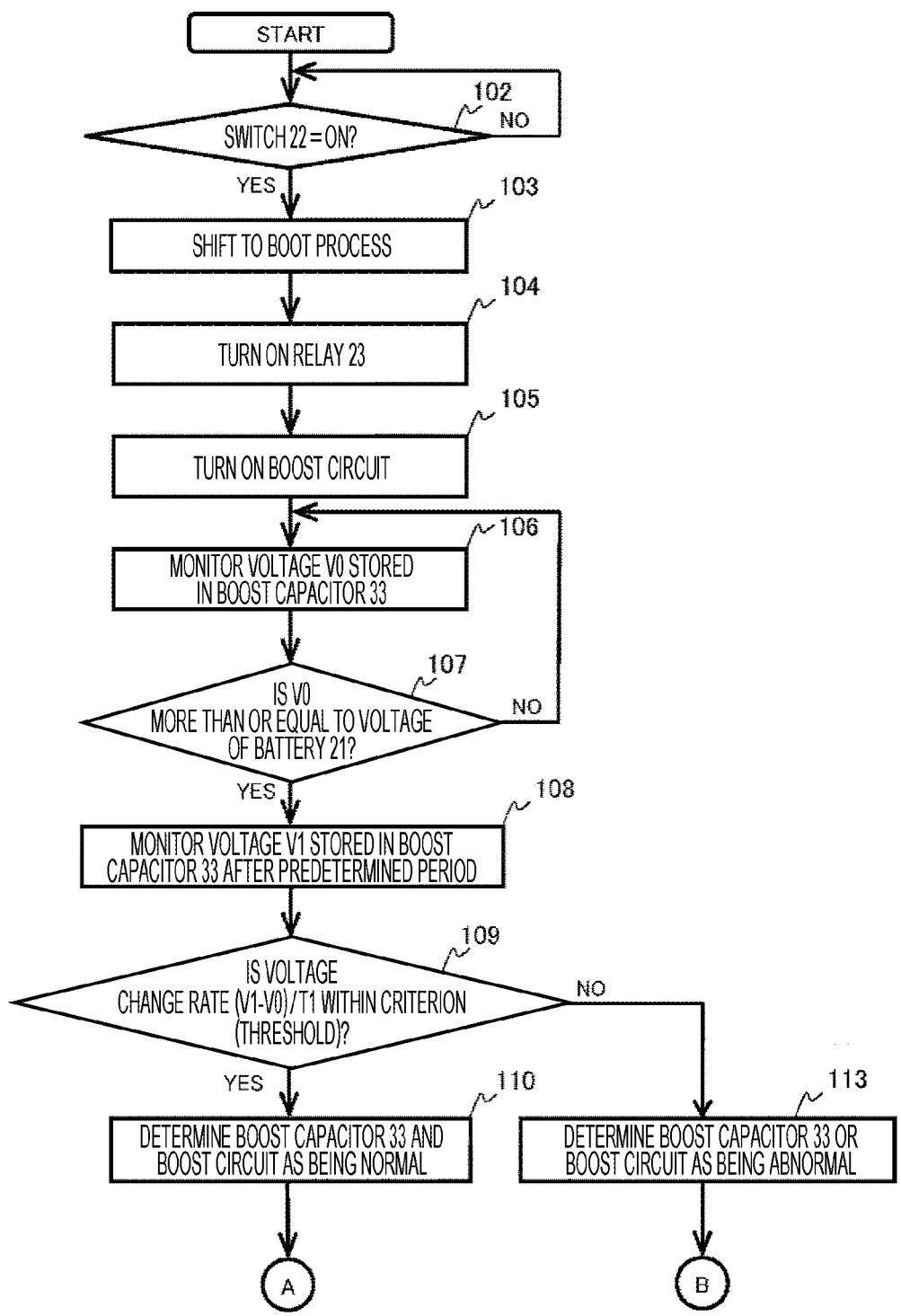
FIG. 5(A) is a flowchart (A) illustrating another example of the control device according to the present invention.
Figure 5B:
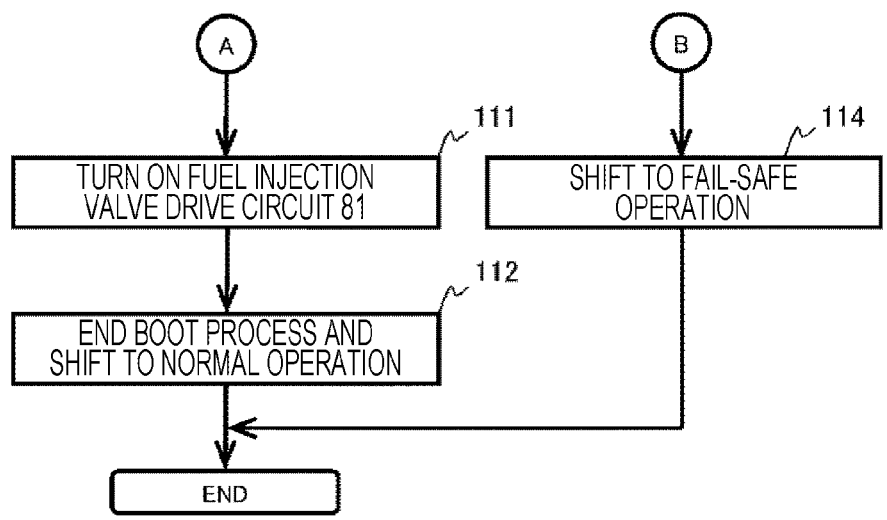
FIG. 5(B) is a flowchart (B) illustrating another example of the control device according to the present invention.

Next, another Example of the present invention will be described with reference to the flowchart of FIGS. 5(A) and 5(B).

This flowchart includes: a branch block 102 in which whether the switch 22 is on is monitored; a block 103 in which the operation shifts to the boot operation; a block 104 in which the relay 23 is turned on; a block 105 in which the boost circuit is turned on; a block 106 in which the voltage V0 stored in the boost capacitor 33 is monitored; a branch block 107 in which whether the voltage V0 stored in the boost capacitor 33 is more than or equal to the voltage of the battery power source 21; a block 108 in which the voltage V0 stored in the boost capacitor 33 is monitored after a predetermined period; a branch block 109 in which whether the voltage change rate $(V1-V0)/T1$ of the boost capacitor 33 is within the criterion (threshold); a block 110 in which the boost capacitor 33 and the boost circuit are determined as being normal; a block 111 in which the fuel injection valve drive circuit is turned on; a block 112 in which the boot process ends and the normal operation starts; a block 113 in which the boost capacitor 33 and the boost circuit are determined as being abnormal; and a block 114 in which the operation shifts to the fail-safe operation.

Next, description is made of the case in which the switch 22 is off.

Upon the start of the present control, the process advances to the branch block 102. Here, whether the process shifts to the boot process is determined depending on the state of the switch 22. If the switch 22 is off, the boot process is not started and the state returns to the initial state.

Next, description is made of the case in which the switch 22 is on and the voltage change rate $(V1-V0)/T1$ of the boost capacitor 33 is within the criterion (threshold).

Upon the start of the present control, the process advances to the branch block 102. Here, whether the process shifts to the boot process is determined depending on the state of the switch 22. Since the switch 22 is on in this description, the process advances to the block 103 and the operation shifts to the boot operation. Next, the process advances to the block 104 in which the relay 23 is turned on. Next, the process advances to the block 105 in which the boost circuit is turned on. Next, the process advances to the block 106 in which the voltage V0 stored in the boost capacitor 33 is monitored. Next, the process advances to the branch block 107 in which whether the voltage V0 stored in the boost capacitor 33 is more than or equal to the voltage of the battery power source 21 is determined. The present invention is featured in that the V0 is monitored at a timing after the boost circuit starts to operate while the voltage V0 is more than or equal to the voltage of the battery power source 21. If the voltage V0 stored in the boost capacitor 33 is less than or equal to the voltage of the battery power source 21, the process returns to the block 106 and again the voltage V0 stored in the boost capacitor 33 is monitored. If the voltage V0 stored in the boost capacitor 33 is more than or equal to the voltage of the battery power source 21, the process advances to the branch block 108 in which whether the voltage change rate $(V1-V0)/T1$ of the boost capacitor 33 is within the criterion (threshold) is determined. In this description, since the voltage change rate $(V1-V0)/T1$ of the boost capacitor 33 is within the criterion (threshold), the process advances to the block 110 in which the boost capacitor 33 and the boost circuit are determined as being normal. Next, the process advances to the block 111 in which the fuel injection valve drive circuit is turned on, and then the process advances to the block 112 in which the boot process ends and the normal operation starts.

Next, description is made of the case in which the switch 22 is on and the voltage change rate $(V1-V0)/T1$ of the boost capacitor 33 is out of the criterion (threshold).

Upon the start of the present control, the process advances to the branch block 102. Here, whether the process shifts to the boot process is determined depending on the state of the switch 22. Since the switch 22 is on in this description, the process advances to the block 103 and the operation shifts to the boot operation. Next, the process advances to the block 104 in which the relay 23 is turned on. Next, the process advances to the block 105 in which the boost circuit is turned on. Next, the process advances to the block 106 in which the voltage V0 stored in the boost capacitor 33 is monitored. Next, the process advances to the branch block 107 in which whether the voltage V0 stored in the boost capacitor 33 is more than or equal to the voltage of the battery power source 21 is determined. The present invention is featured in that the V0 is monitored at a timing after the boost circuit starts to operate while the voltage V0 is more than or equal to the voltage of the battery power source 21. If the voltage V0 stored in the boost capacitor 33 is less than or equal to the voltage of the battery power source 21, the process returns to the block 106 and again the voltage V0 stored in the boost capacitor 33 is monitored. If the voltage V0 stored in the boost capacitor 33 is more than or equal to the voltage of the battery power source 21, the process advances to the branch block 108 in which whether the voltage change rate (V1−V0)/T1 of the boost capacitor 33 is within the criterion (threshold) is determined. In this description, since the voltage change rate (V1−V0)/T1 of the boost capacitor 33 is out of the criterion (threshold), the process advances to the block 113 in which the boost capacitor 33 or the boost circuit is determined as being abnormal. Next, the process advances to the block 114 in which the operation shifts to the fail-safe operation.

Figure 6:
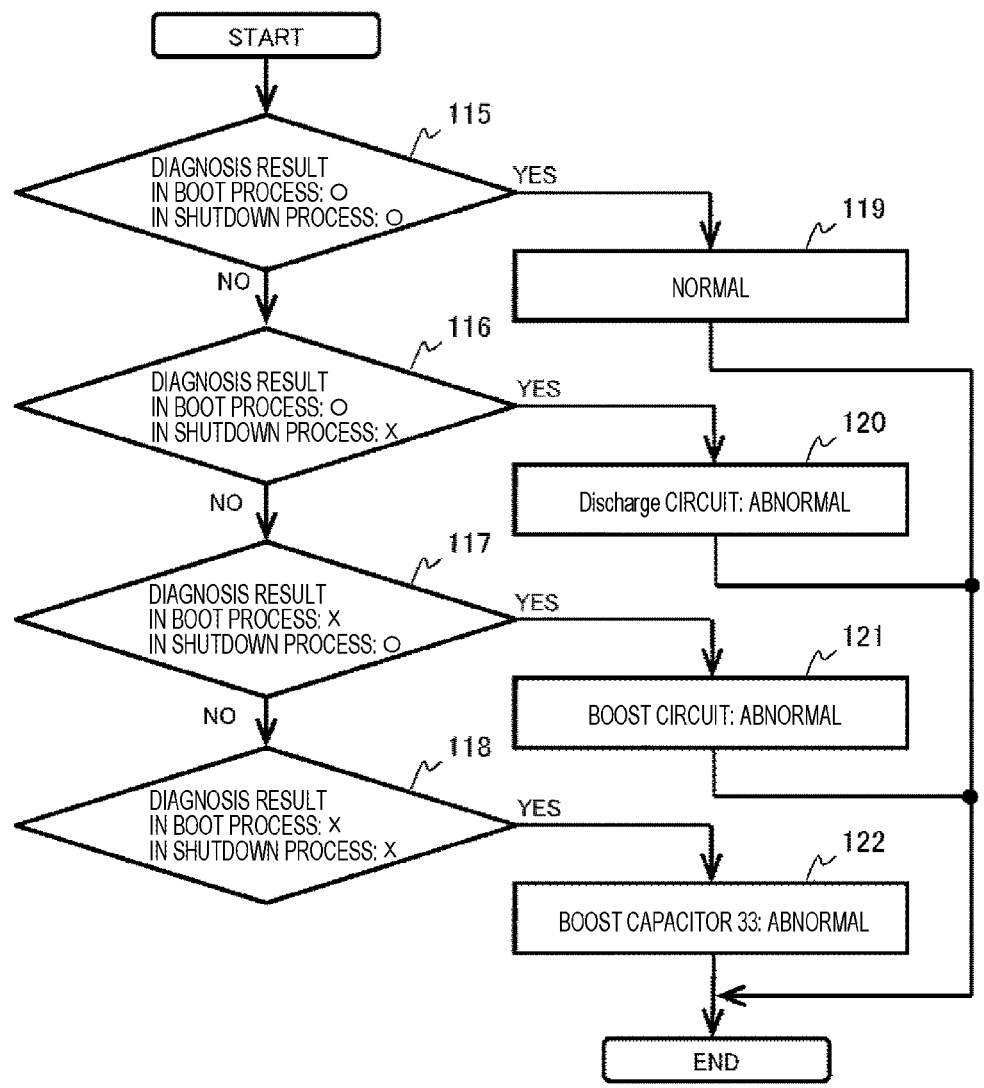
FIG. 6 is a flowchart illustrating another example of the control device according to the present invention.

Next, another Example is described with reference to the flowchart of FIG. 6. In this Example, which part of the boost circuit, the discharge circuit, and the boost capacitor 33 is abnormal, i.e., the part which has failed is specified based on the diagnosis results of Example 1 and the results of diagnosing the boost capacitor 33 and the boost circuit in the boot process.

This flowchart includes: a branch block 115 in which both diagnosis results in the boot process and the shutdown process are normal; a branch block 116 in which the diagnosis result in the boot process is normal and the diagnosis result in the shutdown process is abnormal; a branch block 117 in which the diagnosis result in the boot process is abnormal and the diagnosis result in the shutdown process is normal; and a branch block 118 in which both diagnosis results in the boot process and the shutdown process are abnormal.

Next, description is made of the case in which both diagnosis results in the boot process and the shutdown process are normal. Upon the start of the present control, the process advances to the branch block 115. In this description, both diagnosis results in the boot process and the shutdown process are normal; therefore, the process advances to the block 119 in which they are determined as being normal.

Next, description is made of the case in which the diagnosis result in the boot process is normal and the diagnosis result in the shutdown process is abnormal. Upon the start of the present control, the process advances to the branch block 115. In this description, the diagnosis result in the boot process is normal and the diagnosis result in the shutdown process is abnormal; therefore, the process advances to the branch block 116. If the diagnosis result in the boot process is normal and the diagnosis result in the shutdown process is abnormal, the boost capacitor 33 has not failed; therefore, the discharge circuit is specified as the part which has failed in the block 120.

Next, description is made of the case in which the diagnosis result in the boot process is abnormal and the diagnosis result in the shutdown process is normal. Upon the start of the present control, the process advances to the branch block 115. In this description, the diagnosis result in the boot process is abnormal and the diagnosis result in the shutdown process is normal; therefore, the process advances to the branch block 117 through to the branch block 116. If the diagnosis result in the boot process is abnormal and the diagnosis result in the shutdown process is normal, the boost capacitor 33 has not failed; therefore, the boost circuit is specified as the part which has failed in the block 121.

Next, description is made of the case in which both diagnosis results in the boot process and the shutdown process are abnormal. Upon the start of the present control, the process advances to the branch block 115. In this description, both diagnosis results in the boot process and the shutdown process are abnormal; therefore, the process advances to the branch block 118 through the branch block 116 and the branch block 117. When both diagnosis results in the boot process and the shutdown process are abnormal, the boost capacitor 33 which is common to the both is abnormal; therefore, the boost capacitor 33 is specified as the part which has failed in the block 122.

As described above, according to the present Example using the diagnosis results of Example 1 and the results of diagnosing the boost capacitor 33 and the boost circuit in the boot process, which part of the boost circuit, the discharge circuit, and the boost capacitor 33 is abnormal, i.e., the part which has failed can be specified.

REFERENCE SIGNS LIST 11 control device
21 battery power source
22 switch
23 relay
31 boost coil
32 switching element (such as FET)
33 boost capacitor
41 discharging switch (such as FET)
42 means that restricts the current of stored charges (such as discharge resistor or constant-current source)
51, 52 resistor of monitoring circuit
53 capacitor of monitoring circuit
61 MPU
71 driver IC for controlling boost circuit, discharge circuit, and monitoring circuit
81 fuel injection valve drive circuit

The invention claimed is:

1. A fuel injection valve drive control device for an internal combustion engine, comprising:
   a boost coil;
   a switching element that supplies switching current from a battery power source voltage to the boost coil;
   a boost circuit including a boost capacitor that stores boosted voltage generated by an operation of the switching element;
   a discharge circuit that releases stored charges to GND through a resistor that restricts current of the stored charges and a discharge switch; and
   a monitoring circuit that monitors the stored voltage, the battery power source voltage and the boosted voltage stored in the boost capacitor being used to drive a fuel injection valve, wherein
   the fuel injection valve drive control device causes the discharge circuit to operate when shutdown of the boost circuit is executed by switching the switching element to an off condition, and
   deterioration/failure of the boost capacitor is diagnosed and an operation of the discharge circuit is checked based on a voltage monitor value of the boost capacitor when a discharge operation starts and a voltage monitor value of the boost capacitor after a predetermined period, the deterioration/failure diagnosis of the boost capacitor and the operation of the discharge circuit being performed during the shutdown of the boost circuit to determine whether one or more parts has failed.

2. The fuel injection valve drive control device according to claim 1, wherein the fuel injection valve drive control device diagnoses the deterioration/failure of the boost capacitor every time in a state that the fuel injection valve is not in operation in a shutdown time.

3. The fuel injection valve drive control device according to claim 1, wherein a voltage of the boost capacitor more than or equal to a voltage of the battery power source after the boost circuit starts to operate in a period after power is supplied to the fuel injection valve drive control device and before the fuel injection valve is driven, and a voltage value of the boost capacitor after a predetermined time are monitored, diagnosis is carried out by a combination of monitor results on the voltages of the boost capacitor in a power supply time and in the shutdown time, and if an abnormality is found, a part which has failed is can specified, wherein the part includes any combination of the boost circuit, the discharge circuit, or the boost capacitor.

4. The fuel injection valve drive control device according to claim 1, wherein the voltage of the boost capacitor when voltage boosting starts and the voltage value of the boost capacitor after the predetermined period are monitored every time in a state that the fuel injection valve is not in operation in a period after power is supplied to the fuel injection valve drive control device and before the fuel injection valve is driven.

\* \* \* \* \*